US012671437B1

(12) United States Patent　　　　　　(10) Patent No.: US 12,671,437 B1

Huang et al.　　　　　　　　　　　　　　(45) Date of Patent: Jun. 30, 2026

(54) RESISTOR LADDER-BASED MULTI-REFERENCE VOLTAGE GENERATOR WITH HEADROOM INCREASING CIRCUITRY

(71) Applicant: QUALCOMM Incorporated, San Diego, CA (US)

(72) Inventors: Jiannan Huang, San Diego, CA (US); Behnam Sedighi, La Jolla, CA (US); Dinesh Jagannath Alladi, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 10 days.

(21) Appl. No.: 19/062,447

(22) Filed: Feb. 25, 2025

(51) Int. Cl.
　　　*H03M 1/78*　　　　(2006.01)
　　　*G11C 5/14*　　　　(2006.01)
(52) U.S. Cl.
　　　CPC ............. *H03M 1/785* (2013.01); *G11C 5/147* (2013.01)
(58) Field of Classification Search
　　　CPC ............................... G11C 5/147; H03M 1/785
　　　USPC ................................................. 327/538, 540
　　　See application file for complete search history.

(56) References Cited

U.S. PATENT DOCUMENTS

| | | | | |
|---|---|---|---|---|
| 5,296,858 A | * | 3/1994 | Moyal ................... | H03M 1/147 |
| | | | | 341/156 |
| 5,528,242 A | * | 6/1996 | Kumar .................. | H03M 1/146 |
| | | | | 341/159 |
| 6,100,837 A | * | 8/2000 | Takeuchi .............. | H03M 1/468 |
| | | | | 341/161 |
| 6,211,712 B1 | * | 4/2001 | Baik ..................... | H03K 3/0377 |
| | | | | 327/63 |
| 6,316,991 B1 | * | 11/2001 | Muyshondt .............. | H03L 7/06 |
| | | | | 327/543 |
| 6,778,122 B2 | * | 8/2004 | Lien ..................... | H03M 1/0682 |
| | | | | 341/154 |
| 7,109,904 B2 | * | 9/2006 | Fotouhi ................... | H03M 1/68 |
| | | | | 341/154 |
| 7,372,387 B2 | * | 5/2008 | Li ........................ | H03M 1/765 |
| | | | | 341/145 |
| 7,382,302 B2 | * | 6/2008 | Muramatsu ............. | H03M 1/46 |
| | | | | 341/172 |
| 10,075,179 B1 | | 9/2018 | Keane et al. | |
| 11,409,313 B2 | | 8/2022 | Jiang | |
| 11,705,890 B2 | | 7/2023 | Banerjee et al. | |
| 2002/0047791 A1 | * | 4/2002 | Ishii ..................... | H03M 1/682 |
| | | | | 341/136 |

OTHER PUBLICATIONS

Texas Instruments Inc: "Comparator B (Comp_B)", Chapter 1 SLAU408F—Aug. 2012—Revised Mar. 2018, 17 Pages.

* cited by examiner

*Primary Examiner* — William Hernandez

(74) *Attorney, Agent, or Firm* — Loza & Loza, LLP

(57)　　　　　　　　ABSTRACT

A multi-reference voltage generator, comprising: a current source; a set of resistors coupled in series with the current source between an upper voltage rail and a lower voltage rail; a first set of switching devices coupled between a first output and a set of taps at respective terminals of the set of resistors, wherein the set of taps includes a first tap and a second tap; a second set of switching devices coupled between a second output and the set of taps, respectively; a switching device coupled between the first tap and the second tap; and a control circuit including an output coupled to a control input of the switching device.

20 Claims, 6 Drawing Sheets

$$V_{REF} = V_B = I_B * (j*R + R0),$$
where SWj is selected

800

810

VDD $I_B$ $V_B$

CONTROL CIRCUIT 820

CS $SW_S$

SW1N          $T_N$          SW2N

SW1N-1          RN          SW2N-1
          $T_{N-1}$

SW1N-2          RN-1          SW2N-2
          $T_{N-2}$ $T_{n+m}$ $V_{REF1}$          SW1n+m          SW2n+m          $V_{REF2}$

SW11          $T_1$          SW21

SW10          R1          SW20
          $T_0$ sel1

R0 sel2

$V_B$ $TH_{HR}$ $T_N$

Extra HR $T_{n+M}$ $I_B*(N*R+R0)$

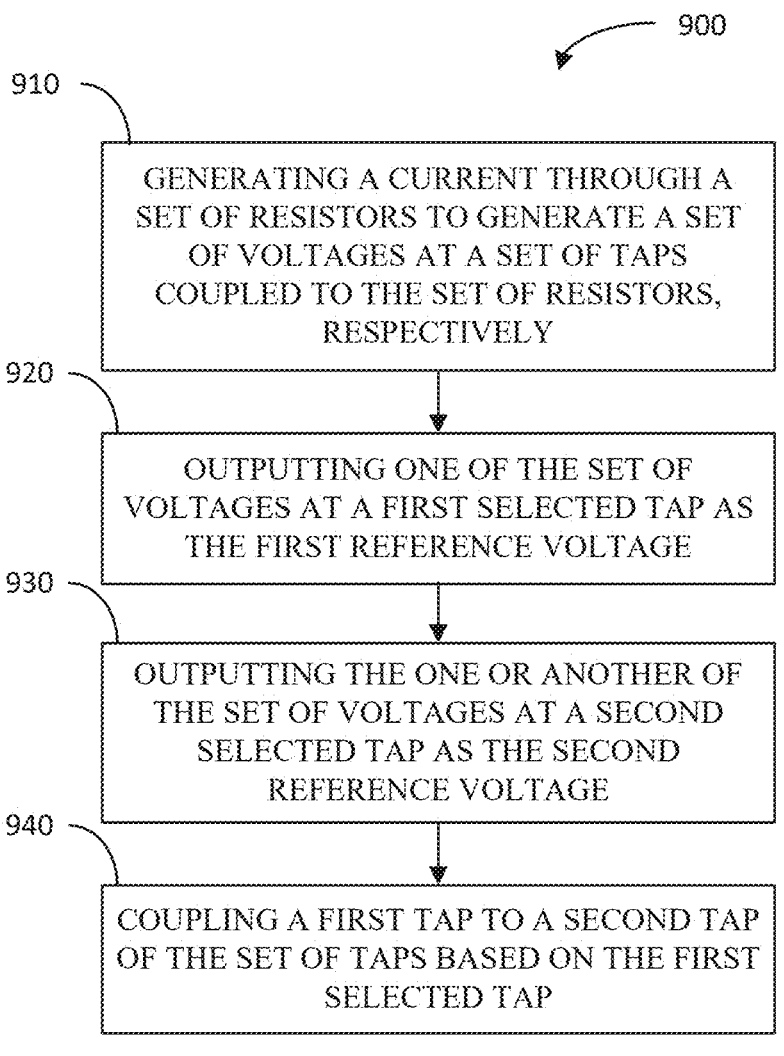

900

910

GENERATING A CURRENT THROUGH A
SET OF RESISTORS TO GENERATE A SET
OF VOLTAGES AT A SET OF TAPS
COUPLED TO THE SET OF RESISTORS,
RESPECTIVELY

920

OUTPUTTING ONE OF THE SET OF
VOLTAGES AT A FIRST SELECTED TAP AS
THE FIRST REFERENCE VOLTAGE

930

OUTPUTTING THE ONE OR ANOTHER OF
THE SET OF VOLTAGES AT A SECOND
SELECTED TAP AS THE SECOND
REFERENCE VOLTAGE

940

COUPLING A FIRST TAP TO A SECOND TAP
OF THE SET OF TAPS BASED ON THE FIRST
SELECTED TAP

FIG. 9

RESISTOR LADDER-BASED MULTI-REFERENCE VOLTAGE GENERATOR WITH HEADROOM INCREASING CIRCUITRY

FIELD

This disclosure relates generally to voltage generators, and in particular, to a resistor ladder-based multi-reference voltage generator with headroom increasing circuitry.

BACKGROUND

Many circuits require a reference voltage to perform its operation. For example, certain analog-to-digital converters (ADCs) may use a reference voltage to convert an input analog signal into an output analog signal. In certain receivers that employ in-phase (I) and quadrature-phase (Q) demodulation and processing, an I-ADC is included to convert an I-analog signal into an I-digital signal using a first reference voltage, and a Q-ADC is included to convert a Q-analog signal into a Q-digital signal using a second reference voltage. In such receivers, a multi-voltage reference voltage generator may be used to generate the first and second reference voltages.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to a multi-reference voltage generator. The multi-reference voltage generator, includes: a current source; a set of resistors coupled in series with the current source between an upper voltage rail and a lower voltage rail; a first set of switching devices coupled between a first output and a set of taps at respective terminals of the set of resistors, wherein the set of taps includes a first tap and a second tap; a second set of switching devices coupled between a second output and the set of taps, respectively; a switching device coupled between the first tap and the second tap; and a control circuit including an output coupled to a control input of the switching device.

Another aspect of the disclosure relates to a method of generating first and second reference voltages. The method includes: generating a current through a set of resistors to generate a set of voltages at a set of taps coupled to the set of resistors, respectively; outputting one of the set of voltages at a first selected tap as the first reference voltage; outputting the one or another of the set of voltages at a second selected tap as the second reference voltage; and coupling a first tap to a second tap of the set of taps based on the first selected tap.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 9 illustrates a flow diagram of an example method of generating multiple reference voltages in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. The term "substantially" means that the associated parameter may not be exact as indicated but accounts for some variation due to specified tolerances.

Figure 1:
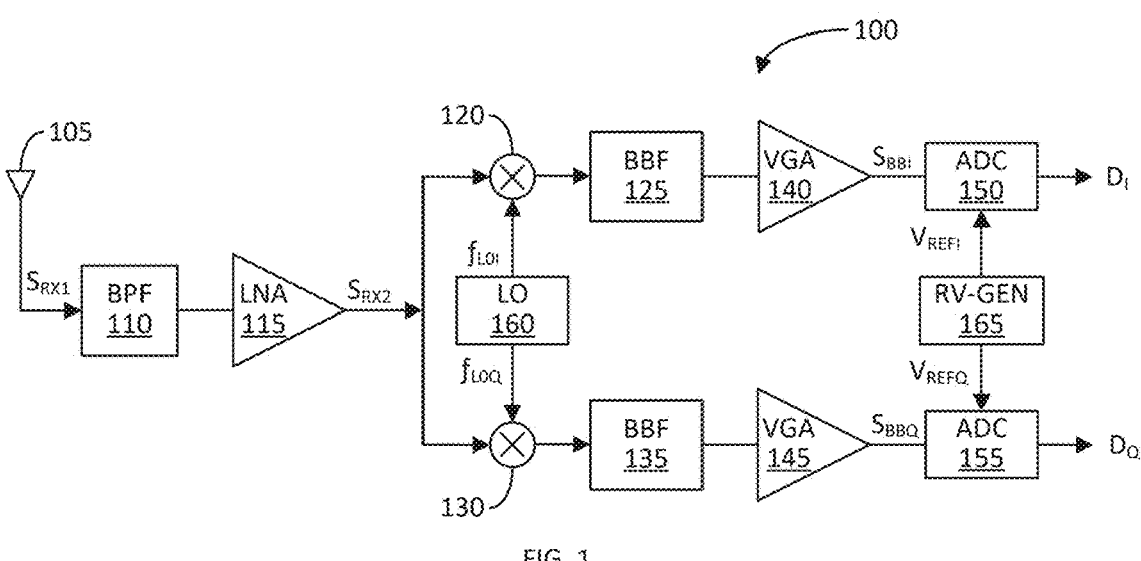
FIG. 1 illustrates a block diagram of an example receiver in accordance with an aspect of the disclosure.

FIG. 1 illustrates a block diagram of an example receiver 100 in accordance with an aspect of the disclosure. The receiver 100 includes an antenna 105, a band pass filter (BPF) 110, and a low noise amplifier (LNA) 115. The receiver 100 further includes an in-phase (I) signal processing circuit including a mixer 120, a baseband filter (BBF) 125, a variable gain amplifier (VGA) 140, and an analog-to-digital converter (ADC) 150. The receiver 100 also includes a quadrature-phase (I) signal processing circuit including a mixer 130, a BBF 135, a VGA 140, and an ADC 155. Common to both the I- and Q-signal processing circuits, the receiver 100 includes a local oscillator (LO) 160 and a reference voltage generator (RV-GEN) 165.

The antenna 105 is configured to wirelessly pick-up/sense a first received radio frequency (RF) signal $S_{RX1}$. The BPF 110 and LNA 115 are configured to respectively band pas filter and low noise amplify the first received RF signal $S_{RX1}$ to generate a second received RF signal $S_{RX2}$. The LO 160 is configured to generate an in-phase (I) LO signal $f_{LOI}$ and a quadrature-phase (Q) LO signal $f_{LOQ}$. The mixer 120 is configured to mix the second RF signal $S_{RX2}$ with the in-phase (I) LO signal $f_{LOI}$ to generate a mixed signal, which is further filtered by the BBF 125 and amplified by the VGA 140 to generate an in-phase (I) analog baseband signal $S_{BBI}$. Similarly, the mixer 130 is configured to mix the second RF signal $S_{RX2}$ with the quadrature-phase (Q) LO signal $f_{LOQ}$ to generate a mixed signal, which is further filtered by the BBF 135 and amplified by the VGA 145 to generate a quadrature-phase (I) analog baseband signal $S_{BBQ}$.

The ADC 150 is configured to convert the in-phase (I) analog baseband signal $S_{BBI}$ into an in-phase (I) digital signal $D_I$ based on an in-phase (I) reference voltage $V_{REFI}$ generated by reference voltage generator 165. The ADC 155 is configured to convert the quadrature-phase (I) analog baseband signal $S_{BBQ}$ into a quadrature-phase (Q) digital signal $D_Q$ based on a quadrature-phase (Q) reference voltage $V_{REFQ}$ generated by the reference voltage generator 165. For the ADCs 150 and 155 to accurately generate the in-phase (I) and quadrature-phase (Q) digital signals $D_I$ and $D_Q$, the reference voltage generator 165 should generate accurate (e.g., by calibration) in-phase (I) and quadrature-phase (Q) reference voltages $V_{REFI}$ and $V_{REFQ}$, respectively.

Figure 2:
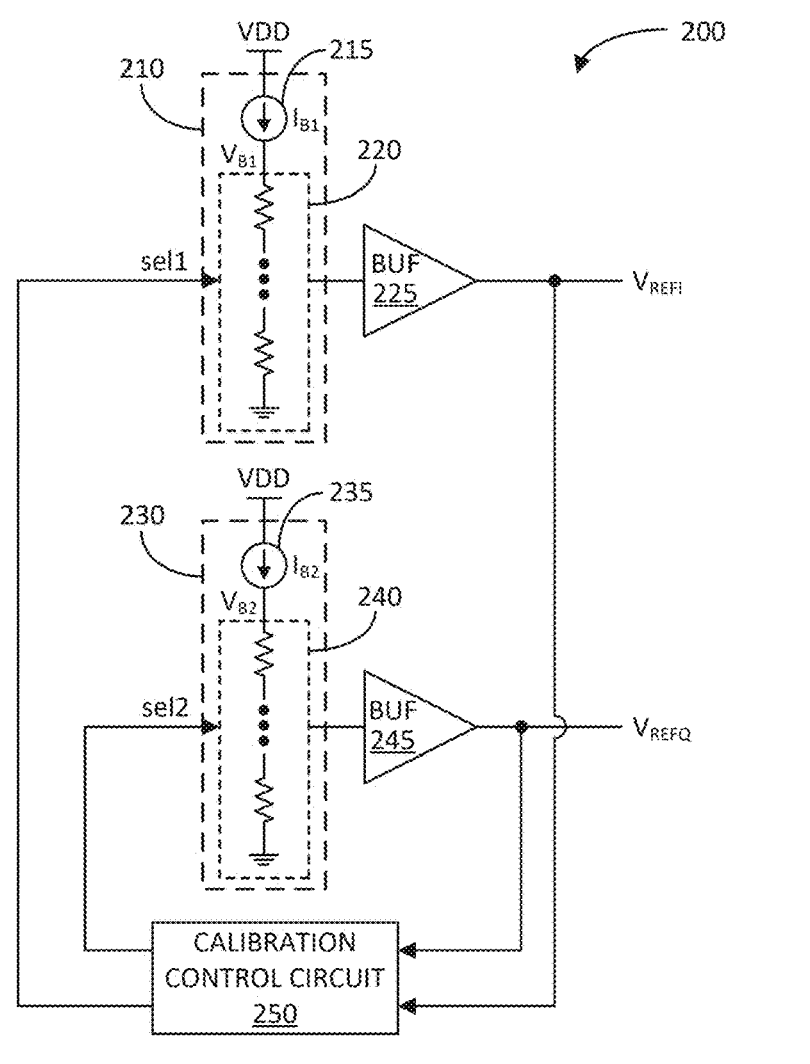
FIG. 2 illustrates a block/schematic diagram of an example multi-reference voltage generator in accordance with another aspect of the disclosure.

FIG. 2 illustrates a block/schematic diagram of an example reference voltage generator 200 in accordance with another aspect of the disclosure. The reference voltage generator 200 may be an example implementation of the reference voltage generator 165 of receiver 100. The reference voltage generator 200 includes an in-phase (I) resistor ladder-based single reference voltage generator 210, an I-buffer 225, a quadrature-phase (Q) resistor ladder-based single reference voltage generator 230, a Q-buffer 245, and a calibration control circuit 250.

The I-resistor ladder-based single reference voltage generator 210 includes a current source 215 coupled in series with a resistor ladder 220 between an upper voltage rail VDD and a lower voltage rail (e.g., ground). The current source 215 is configured to generate a first bias current $I_{B1}$ that flows through the resistor ladder 220 to generate a set of selectable reference voltages. A bias voltage $V_{B1}$, which may be the highest one of the set of selectable reference voltages, is generated at a node between the current source 215 and the resistor ladder 220. A first select signal sel1, generated by the calibration control circuit 250, is configured to select one of the set of selectable reference voltages to output as an unbuffered I-reference voltage $V_{REFI}$. The I-buffer 225 is configured to buffer the resistor ladder 220 to output the I-reference voltage $V_{REFI}$.

The Q-resistor ladder-based single reference voltage generator 230 includes a current source 235 coupled in series with a resistor ladder 240 between the upper voltage rail VDD and the lower voltage rail. The current source 235 is configured to generate a second bias current $I_{B2}$ that flows through the resistor ladder 240 to generate a set of selectable reference voltages. A bias voltage $V_{B2}$, which may be the highest one of the set of selectable reference voltages, is generated at a node between the current source 235 and the resistor ladder 240. A second select signal sel2, generated by the calibration control circuit 250, is configured to select one of the set of selectable reference voltages to output an unbuffered Q-reference voltage $V_{REFQ}$. The Q-buffer 245 is configured to buffer the resistor ladder 240 to output the Q-reference voltage $V_{REFQ}$.

The calibration control circuit 250 includes inputs coupled to outputs of the I-buffer 225 and Q-buffer 245, respectively. The calibration control circuit 250 is configured to generate the control signals sel1 and sel2 based on the I- and Q-reference voltages $V_{REFI}$ and $V_{REFQ}$ generated by the I-buffer 225 and Q-buffer 245, respectively. Accordingly, through the aforementioned feedback arrangement, the calibration control circuit 250 is configured to calibrate the I- and Q-reference voltages $V_{REFI}$ and $V_{REFQ}$ via the control signals sel1 and sel2, respectively.

Figures 3, 4:
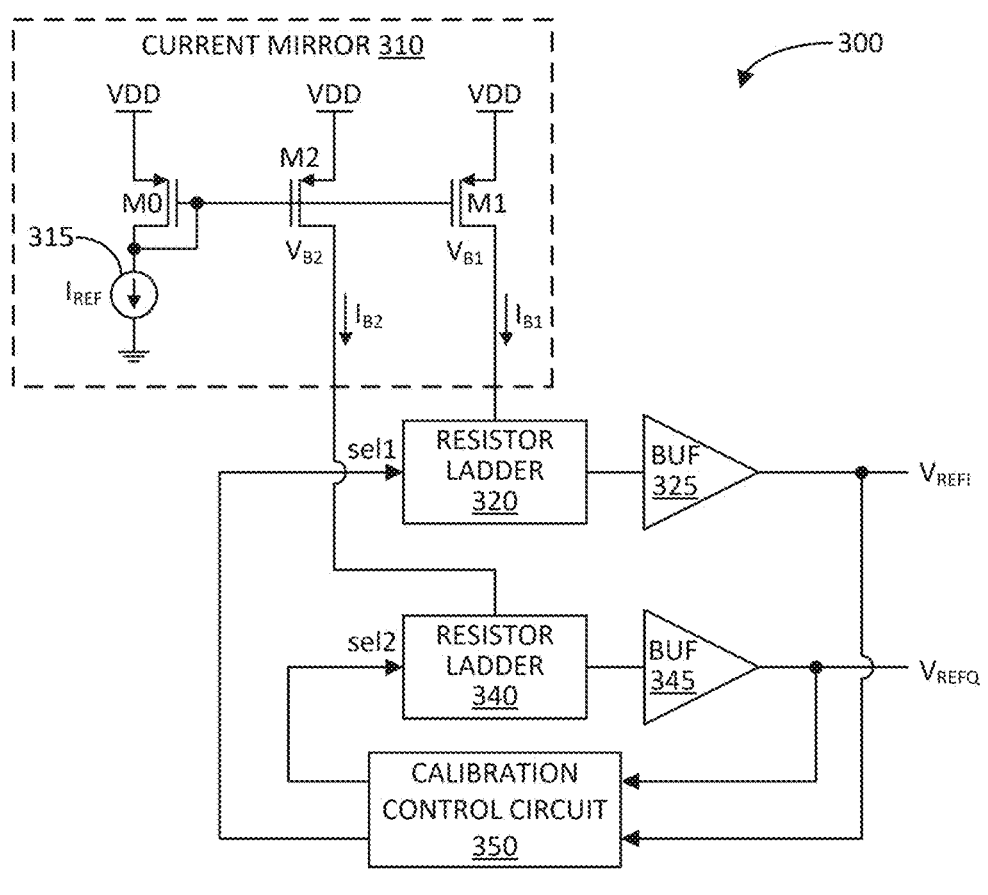
FIG. 3 illustrates a block/schematic diagram of another example multi-reference voltage generator in accordance with another aspect of the disclosure.
FIG. 4 illustrates a block/schematic diagram of another example multi-reference voltage generator in accordance with another aspect of the disclosure.

FIG. 3 illustrates a block/schematic diagram of another example reference voltage generator 300 in accordance with another aspect of the disclosure. The reference voltage generator 300 may be an example implementation of the reference voltage generator 300, in particular, with respect to the current sources 215 and 235. The reference voltage generator 300 includes a current mirror 310, an in-phase (I) resistor ladder 320, an I-buffer 325, a quadrature-phase (Q) resistor ladder 340, a Q-buffer 345, and a calibration control circuit 350.

The current mirror 310 includes a p-channel field effect transistor (PFET) M0 coupled in series with a reference current source 315 between an upper voltage rail VDD and a lower voltage rail (e.g., ground). That is, the PFET M0 includes a source coupled to the upper voltage rail VDD. The reference current source 315, which is configured to generate a reference current $I_{REF}$, is coupled between a gate and a drain of the (diode-connected) PFET M0 and the lower voltage rail.

The PFET M1 is coupled between the upper voltage rail VDD and the I-resistor ladder 320. That is, the PFET M1 includes a source coupled to the upper voltage rail VDD, a gate coupled to the gate and drain of PFET M0, and a drain coupled to the I-resistor ladder 320. The PFET M2 is coupled between the upper voltage rail VDD and the Q-resistor ladder 340. That is, the PFET M2 includes a source coupled to the upper voltage rail VDD, a gate coupled to the gate and drain of PFET M0, and a drain coupled to the Q-resistor ladder 340.

Due to a current mirror coupling between the PFET M0 and the PFETs M1 and M2, the PFETs M1 and M2 are configured to generate bias currents $I_{B1}$ and $I_{B2}$ based on the reference current $I_{REF}$. Similarly, as discussed with respect to multi-reference voltage generator 200, the I-resistor ladder 320 is configured to generate a set of selectable reference voltages based on the first bias current $I_{B1}$. A first bias voltage $V_{B1}$, which may be the highest one of the set of selectable reference voltages, is generated at the drain of the PFET M1. A first select signal sel1, generated by the calibration control circuit 350, is configured to select one of the set of selectable reference voltages to output as an unbuffered I-reference voltage $V_{REFI}$. The I-buffer 325 is configured to buffer the I-resistor ladder 320 to output the I-reference voltage $V_{REFI}$.

The Q-resistor ladder 340 is configured to generate a set of selectable reference voltages based on the second bias current $I_{B2}$. A second bias voltage $V_{B2}$, which may be the highest one of the set of selectable reference voltages, is generated at the drain of the PFET M2. A second select signal sel2, generated by the calibration control circuit 350, is configured to select one of the set of selectable reference voltages to output as an unbuffered Q-reference voltage $V_{REFI}$. The Q-buffer 345 is configured to buffer the Q-resistor ladder 340 to output the Q-reference voltage $V_{REFQ}$. The calibration control circuit 350, including inputs coupled to the outputs of the I-buffer 325 and Q-buffer 345, is configured to calibrate the I- and Q-reference voltages $V_{REFI}$ and $V_{REFQ}$ via the control signals sel1 and sel2, respectively.

An issue with the multi-reference voltage generators 200 and 300 is significant mismatch between the temperature drifts of the I- and Q-reference voltages $V_{REFI}$ and $V_{REFQ}$. The discrepancy in temperature drifts of the reference voltages $V_{REFI}$ and $V_{REFQ}$ may cause error in the generating of the I- and/or Q-data signals $D_I$ and $D_Q$ in receiver 100. Such discrepancy in the temperature drafts may be due to inaccuracy and mismatch in the mirroring of the reference current $I_{REF}$ to the first and second bias currents $I_{B1}$ and $I_{B2}$. The temperature drifts discrepancy also may be due to mismatches in the resistors of the I- and Q-resistor ladders 220/320 and 240/340.

FIG. 4 illustrates a block/schematic diagram of another example multi-reference voltage generator 400 in accordance with another aspect of the disclosure. The multi-reference voltage generator 400 may solve the discrepancy in the temperature drifts of the of the I- and Q-reference voltages $V_{REFI}$ and $V_{REFQ}$ by employing a common current source and a common resistor ladder in connection with generating the reference voltages $V_{REFI}$ and $V_{REFQ}$. In particular, the multi-reference voltage generator 400 includes an I/Q resistor ladder-based multi-reference voltage generator 410, an I-buffer 425, a Q-buffer 430, and a calibration control circuit 440.

The I/Q resistor ladder-based multi-reference voltage generator 410 includes a current source 415 and a resistor ladder 420. The current source 415 is configured to generate a bias current $I_B$ flowing through the resistor ladder 420 to generate a set of selectable reference voltages. The resistor ladder 420 is configured to output one of the set of selectable reference voltages as an unbuffered I-reference voltage $V_{REFI}$ based on a first select signal sel1. The resistor ladder 420 is also configured to output one of the set of selectable reference voltages as an unbuffered Q-reference voltage $V_{REFQ}$ based on a second select signal sel2. A bias voltage $V_B$, which may be the highest one of the set of selectable reference voltages, is generated at a node between the current source 415 and the resistor ladder 420.

The I-buffer 425 is configured to buffer the resistor ladder 420 to output the I-reference voltage $V_{REFI}$. The Q-buffer 430 is also configured to buffer the resistor ladder 420 to output the Q-reference voltage $V_{REFQ}$. The calibration control circuit 440 includes inputs coupled to outputs of the I-buffer 425 and Q-buffer 430, respectively. The calibration control circuit 440 is configured to generate the control signals sel1 and sel2 based on the I- and Q-reference voltages $V_{REFI}$ and $V_{REFQ}$ generated by the I-buffer 425 and Q-buffer 430, respectively. Accordingly, through the aforementioned feedback arrangement, the calibration control circuit 440 is configured to calibrate the I- and Q-reference voltages $V_{REFI}$ and $V_{REFQ}$ via the control signals sel1 and sel2, respectively.

Figure 5:
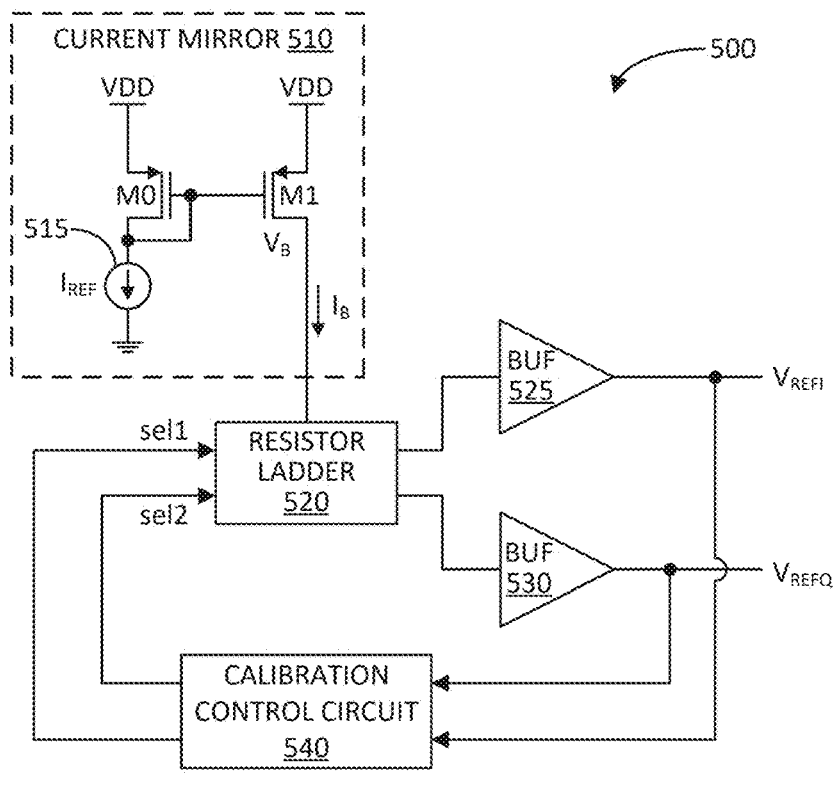
FIG. 5 illustrates a block/schematic diagram of another example multi-reference voltage generator in accordance with another aspect of the disclosure.

FIG. 5 illustrates a block/schematic diagram of another example reference voltage generator 500 in accordance with another aspect of the disclosure. The reference voltage generator 500 may be an example implementation of the reference voltage generator 400, in particular, with respect to the current source 415. The reference voltage generator 500 includes a current mirror 510, an I/Q resistor ladder 520, an I-buffer 525, a Q-buffer 530, and a calibration control circuit 540.

The current mirror 510 includes a PFET M0 coupled in series with a reference current source 515 between an upper voltage rail VDD and a lower voltage rail (e.g., ground). That is, the PFET M0 includes a source coupled to the upper voltage rail VDD. The reference current source 515, which is configured to generate a reference current $I_{REF}$, is coupled between a gate and a drain of the (diode-connected) PFET M0 and the lower voltage rail (e.g., ground). The PFET M1 is coupled between the upper voltage rail VDD and the I/Q resistor ladder 520. That is, the PFET M1 includes a source coupled to the upper voltage rail VDD, a gate coupled to the gate and the drain of PFET M0, and a drain coupled to the I/Q resistor ladder 520.

Due to a current mirror coupling between the PFET M0 and the PFET M1, the PFET M1 is configured to generate a bias current $I_B$ based on the reference current $I_{REF}$. Similarly, the I/Q resistor ladder 520 is configured to generate a set of selectable voltages based on the bias current $I_B$. A bias voltage $V_B$, which may be the highest one of the set of selectable voltages, is generated at the drain of the PFET M1. First and second select control signals sel1 and sel2, generated by the calibration control circuit 540, are configured to select the same or different ones of the set of selectable voltages to output as unbuffered I- and Q-reference voltages $V_{REFI}$ and $V_{REFQ}$, respectively. The I- and Q-buffers 525 and 530 are configured to buffer the I/Q resistor ladder 520 to output the I- and Q-reference voltages $V_{REFI}$ and $V_{REFQ}$, respectively. The calibration control circuit 540, including inputs coupled to the outputs of the I-buffer 525 and Q-buffer 530, is configured to calibrate the I- and Q-reference voltages $V_{REFI}$ and $V_{REFQ}$ via the control signals sel1 and sel2, respectively.

Figure 6:
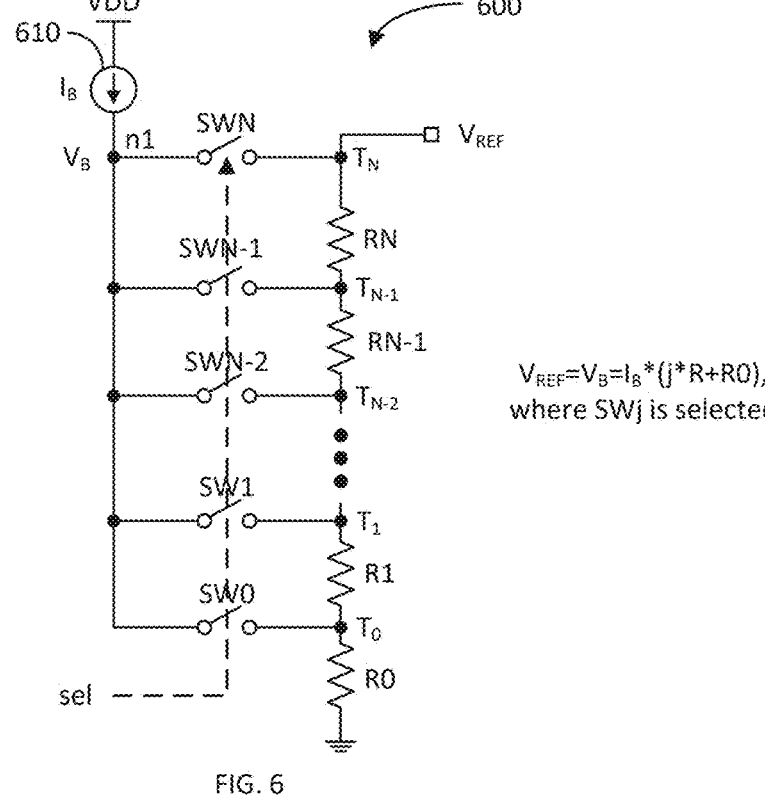
FIG. 6 illustrates a schematic diagram of an example resistor ladder-based single reference voltage generator in accordance with another aspect of the disclosure.

FIG. 6 illustrates a schematic diagram of an example resistor ladder-based single reference voltage generator 600 in accordance with another aspect of the disclosure. The resistor ladder-based single reference voltage generator 600 may be an example of one of the resistor ladder-based single reference voltage generator 210, 230, 320, or 340 previously discussed. The reference voltage generator 600 includes a current source 610, a set of N+1 resistors R0 to RN, and a set of N+1 switching devices SW0 to SWN.

The current source 610 is coupled between an upper voltage rail VDD and a node n1. The set of N+1 resistors R0 to RN are coupled in series, in that order, between a lower voltage rail (e.g., ground) and an output of the resistor ladder-based single reference voltage generator 600. The upper terminals (closest to the output of the resistor ladder-based single reference voltage generator 600) of the set of N+1 resistors R0 to RN may be referred to as taps $T_0$ to $T_N$, respectively. The set of N+1 switching devices SW0 to SWN are coupled between the node n1 and the set of taps $T_0$ to $T_N$, respectively.

The current source 610 is configured to generate a bias current $I_B$. The states ON/OFF (closed/open) of the set of N+1 switching devices SW0 to SWN may be controlled by a select control signal sel, for example, generated by calibration control circuit 250 or 350. The select control signal sel is configured to set one (e.g., the $j^{th}$) of the set of N+1 switching devices SW0 to SWN to an ON (closed) state, and the remaining (e.g., $\neq j^{th}$) of the set of N+1 switching devices SW0 to SWN to OFF (open) states. In such configuration, the resistor ladder-based single reference voltage generator 600 is configured to generate a reference voltage $V_{REF}$ at the tap coupled to the switching device whose state is ON (closed) as set by the select control signal sel. The reference voltage $V_{REF}$ may be given by the following equation: $V_{REF} = I_B * (j * R + R0)$, where R is the resistance of each of the resistors R1 to RN, j is the switching device SWj that is turned ON (closed), R0 is the resistance of resistor R0.

Note that the voltage $V_B$ at node n1 is substantially the same as the output reference voltage $V_{REF}$. In such configuration, there should not be any headroom issues associated with the current source 610. For example, the supply voltage at the upper voltage rail VDD should be sufficiently high enough to accommodate the target reference voltage $V_{REF}$ without collapsing or adversely affecting the operation of the current source 610 (e.g., by operating the corresponding PFET M1 in the triode region). As a more specific example, the supply voltage VDD may be set to 1.2 Volts (V), and the target reference voltage $V_{REF}$ may be at about 0.6V. This results in a 0.6V voltage drop (or drain-to-source voltage Vds) across the current source 610, which provides sufficient margin over its minimum saturation voltage Vdsat of, for example, 0.3V.

Figure 7:
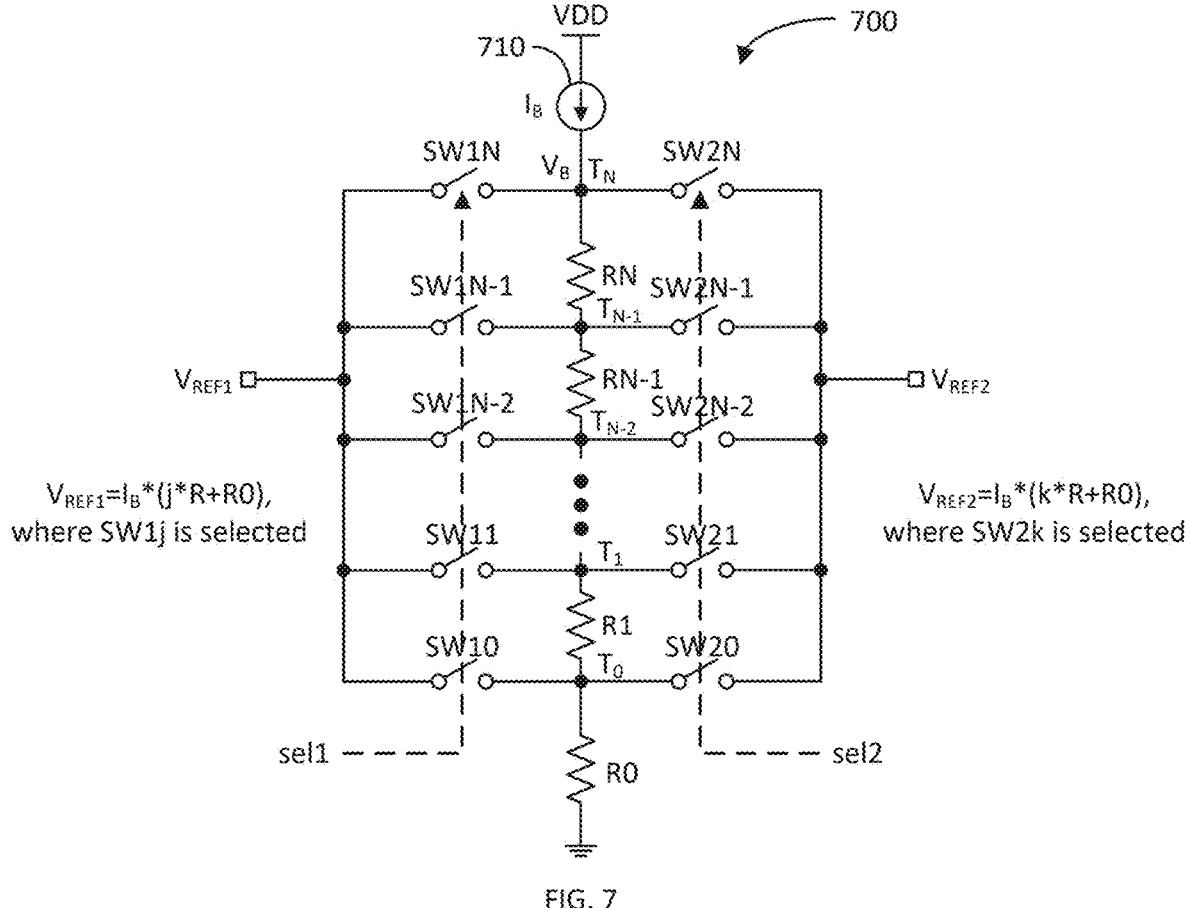
FIG. 7 illustrates a schematic diagram of another example resistor ladder-based multi-reference voltage generator in accordance with another aspect of the disclosure.

FIG. 7 illustrates a schematic diagram of another example resistor ladder-based multi-reference voltage generator 700 in accordance with another aspect of the disclosure. The resistor ladder-based multi-reference voltage generator 700 may be an example of one of the resistor ladder-based multi-reference voltage generator 420 or 520 previously discussed. The reference voltage generator 700 includes a current source 710, a set of N+1 resistors R0 to RN, a first set of N+1 switching devices SW10 to SW1N, and a second set of N+1 switching devices SW20 to SW2N.

The current source 710 and the set of N+1 resistors R0 to RN are coupled in series between an upper voltage rail VDD and a lower voltage rail (e.g., ground). The upper terminals (closest to the upper voltage rail VDD) of the set of N+1 resistors R0 to RN may be referred to as taps $T_0$ to $T_N$, respectively. The first set of N+1 switching devices SW10 to SW1N are coupled between a first reference voltage ($V_{REF1}$) output of the resistor ladder-based multi-reference voltage generator 700 and the set of taps $T_0$ to $T_N$, respectively. The second set of N+1 switching devices SW20 to SW2N are coupled between a second reference voltage ($V_{REF2}$) output of the resistor ladder-based multi-reference voltage generator 700 and the set of taps $T_0$ to $T_N$, respectively.

The states ON/OFF (closed/open) of the first set of N+1 switching devices SW10 to SW1N may be controlled by a first select control signal sel1, for example, generated by calibration control circuit 440 or 540. The first select control signal sel1 is configured to set one (e.g., the $j^{th}$) of the first set of N+1 switching devices SW10 to SW1N to an ON (closed) state, and the remaining (e.g., $\neq j^{th}$) of the first set of N+1 switching devices SW10 to SW1N to OFF (open) states. Similarly, the states ON/OFF (closed/open) of the second set of N+1 switching devices SW20 to SW2N may be controlled by a second select control signal sel2, for example, also generated by calibration control circuit 440 or 540. The second select control signal sel2 is configured to set one (e.g., the $k^{th}$) of the second set of N+1 switching devices SW20 to SW2N to an ON (closed) state, and the remaining (e.g., $\neq k^{th}$) of the second set of N+1 switching devices SW20 to SW2N to OFF (open) states.

The current source 710 is configured to generate a bias current $I_B$ that flows through the set or resistors R0 to RN to generate a set of selectable voltages at the set of taps $T_0$ to $T_N$, respectively. In such configuration, the resistor ladder-based multi-reference voltage generator 700 is configured to output a first reference voltage $V_{REF1}$ at the tap (e.g., $T_j$) coupled to the switching device (e.g., the $j^{th}$) of the first set whose state is ON (closed) as set by the first select control signal sel1. Accordingly, the first reference voltage $V_{REF1}$ may be given by the following equation: $V_{REF}1=I_B*(j*R+$ R0), where R is the resistance of each of the resistors R1 to RN, j is the switching device SW1$j$ that is turned ON (closed), and R0 is the resistance of resistor R0.

Similarly, the resistor ladder-based multi-reference voltage generator 700 is configured to generate a second reference voltage $V_{REF2}$ at the tap (e.g., Tk) coupled to the switching device (e.g., the $k^{th}$) of the second set whose state is ON (closed) as set by the second select control signal sel2. Accordingly, the second reference voltage $V_{REF2}$ may be given by the following equation: $V_{REF}2=I_B*(k*R+R0)$, where k is the switching device SW2$k$. It shall be understood that j and k may be equal to or different from each other (e.g., j=k or j≠k).

In contrast to the resistor ladder-based single reference voltage generator 600 where the bias voltage $V_B$ (e.g., at the lower terminal (e.g., drain) of the current source 610 (e.g., PFET)) is set to approximately the target reference voltage (e.g., 0.6V), the bias voltage $V_B$ (e.g., at the lower terminal (e.g., drain) of the current source 710 (e.g., PFET)) of the resistor ladder-based multi-reference voltage generator 700 is set to the maximum of the range of the set of selectable voltages (e.g., $V_B=I_B*(N*R+R0)$). As a consequence, the bias voltage $V_B$ may present headroom issues for the current source 710 especially for a high voltage process corner. For example, the bias voltage $V_B$ for a high voltage process corner at above 0.9V may result in the current source (PFET) 710 operating with a drain-to-source voltage Vds lower than its minimum saturation voltage Vdsat. As a result, the current source (PFET) 710 operates in its triode region, and consequently, ineffectively as a current source.

Figures 8A, 8B:
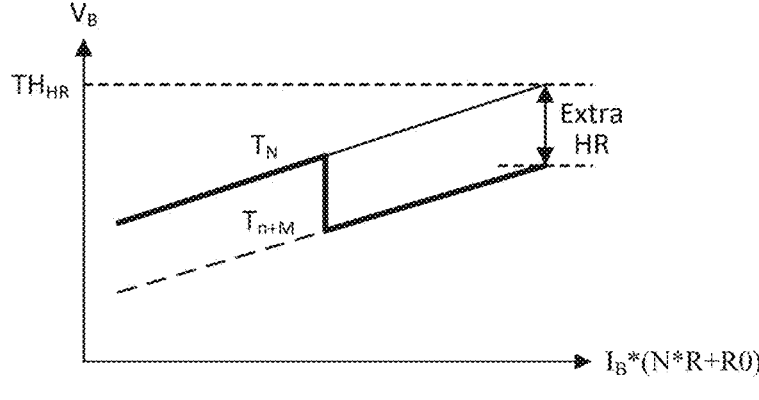
FIG. 8A illustrates a schematic/block diagram of another example resistor ladder-based multi-reference voltage generator in accordance with another aspect of the disclosure.
FIG. 8B illustrates a graph of an example bias voltage $V_B$ versus product of bias current and the total resistance $(I_B*(N*R+R0))$ associated with the resistor ladder-based multi-reference voltage generator of FIG. 8A in accordance with another aspect of the disclosure.

FIG. 8A illustrates a schematic/block diagram of another example resistor ladder-based multi-reference voltage generator 800 in accordance with another aspect of the disclosure. The resistor ladder-based multi-reference voltage generator 800 includes circuitry that addresses the headroom issue associated with the current source 710 of the resistor ladder-based multi-reference voltage generator 700. The resistor ladder-based multi-reference voltage generator 800 is similar to resistor ladder-based multi-reference voltage generator 700 including a current source 810, a set of N+1 resistors R0 to RN, a first set of N+1 switching devices SW10 to SW1N, and a second set of N+1 switching devices SW20 to SW2N in the same arrangement as previously discussed in detail.

The resistor ladder-based multi-reference voltage generator 800 further includes a control circuit 720 and a "shorting" switching device SWs. The control circuit 820 is configured to receive one of the select control signals (e.g., sel1) and generate a control signal (CS) that controls a state ON/OFF (closed/open) of the shorting switching device SWs based on the select control signal sel1. The shorting switching device SWs is coupled between a first tap (e.g., the top tap $T_N$) and a second tap (e.g., an intermediate tap $T_{n+m}$). The variable "n" refers to a tap threshold value of the first select control signal sel1 at (or below) which the control circuit 820 generates the control signal (CS) to close the shorting switching device SWs, or above which the control circuit 820 generates the control signal (CS) to open the shorting switching device SWs (e.g., sel1≤n→CS→SWs is closed; sel1>n→CS→SWS is open). The variable "m" is a margin in the case where the second reference voltage $V_{REF2}$ needs to be higher than the first reference voltage $V_{REF1}$ as discussed further herein. As an example, the tap threshold n may be equal to N/2 (e.g., n=16 where N=32) and m may be equal to four (4) (e.g., m=4).

For example, if the first select signal sel1 is greater than the tap threshold "n" (e.g., sel1>n), it implies a relatively low process corner because a voltage at a higher tap (e.g., above $T_n$) is required to generate the target first reference voltage $V_{REF1}$. Because a relatively low process corner is relevant in this example, the bias voltage $V_B$ should likewise be relatively low to provide a sufficient voltage drop across the current source (PFET) 810 so that it operates effectively as a current source (e.g., operates in the saturation region of the corresponding PFET). Accordingly, the control circuit 820 generates the control signal (CS) to open the shorting switching device SWs; and thereby, the resistor ladder-based multi-reference voltage generator 800 is functionally configured per resistor ladder-based multi-reference voltage generator 700.

If the first select signal sel1 is less than or equal to the tap threshold "n" (e.g., sel1≤n), it implies a relatively high process corner because a voltage at a lower tap (e.g., at or below $T_n$) is required to generate the target first reference voltage $V_{REF1}$. Because a relatively high process corner is relevant in this example, the high bias voltage $V_B$ may cause a headroom issue for the current source 810. Accordingly, the control circuit 820 generates the control signal (CS) to close the shorting switching device SWs. As a result of closing the shorting switching device SWs, the bias voltage $V_B$ may be lowered in accordance with the following equation: $V_B=I_B*((n+m)*R+R0)$ where n+m<N. This may be significantly less than the maximum range of the set of selectable voltage given by $V_B=I_B*(N)*R+R0)$. Thus, the control circuit 820 and shorting switching device SWs coupled between taps $T_N$ and $T_{n+m}$ protect the current source 810 from headroom issues.

With regard to the variable "m", the second reference voltage $V_{REF2}$ may be greater than the first reference voltage $V_{REF1}$. So, if the first select signal sel1 indicates a tap slightly below or at "n", and the second select signal sel2 indicates a tap slightly higher than the first select signal sel1, the variable "m" provides m taps above tap $T_n$ available for generating the second reference voltage $V_{REF2}$. As the first and second reference voltages $V_{REF1}$ and $V_{REF2}$ should be close to each other, a value of four (4) for "m" may be appropriate for a resistor ladder with N=32. The value of "m" may be different for other configurations of the resistor ladder-based multi-reference voltage generator 800.

FIG. 8B illustrates a graph of an example bias voltage $V_B$ versus product of total resistance and bias current $(I_B*(N)*R+R0)$ associated with the resistor ladder-based reference voltage generator 800 in accordance with another aspect of the disclosure. The horizontal axis of the graph represents the process corner as indicated by the product of the bias current $I_B$ and the total resistance of the set of resistors R0 to RN (e.g., $I_B*(N*R+R0)$). The vertical axis represents the bias voltage $V_B$. A horizontal dash line represents the headroom threshold $TH_{HR}$ above which the current source 810 encounters headroom issues.

The thin-solid line represents the bias voltage $V_B$ increase with increase in the process corner in the hypothetical case where the shorting switching device SWs remains open for the entire range of the process corner (e.g., $I_B*(N)*R+R0)$). As shown, at high process corners, the bias voltage $V_B$ approaches and may exceed the headroom threshold $TH_{HR}$; thereby causing headroom issues for the current source 810. The long-dashed line presents the increase in the bias voltage $V_B$ with process corner for the case where the shorting switching device SWs is closed. As shown, even for high process corners, the closing of the shorting switching device SWs provides extra headroom so as to prevent headroom issues for the current source 810.

The thick-solid line represents the operation of the resistor ladder-based multi-reference voltage generator 800. That is, at relative low process corners (e.g., $I_B*(N)*R+R0)$) as indicated by the first select signal sel1 being greater than the tap threshold "n", the control circuit 820 generates the control signal (CS) to set the shorting switching device SWs in its open state. This makes available the set of voltages at in its open state for generating the first and second reference voltages $V_{REF1}$ and $V_{REF2}$ following the bias voltage $V_B$ thin-sold line associated with the case where the shorting switching device SWs is open.

At relative high process corners (e.g., $I_B*(N)*R+R0)$) as indicated by the first select signal sel1 being equal to or less than "n", the control circuit 820 generates the control signal (CS) to set the shorting switching device SWs in its closed state. This makes available the set of voltages at a subset of taps $T_0$ to $T_n$ for generating the first reference voltage $V_{REF1}$ and taps $T_0$ to $T_{n+m}$ for generating the second reference voltage $V_{REF2}$ as indicated by the thick-solid line following the bias voltage $V_B$ long-dashed line associated with the case where the shorting switching device SWs is closed. This prevents headroom issues for the current source 810 as indicated by the extra headroom margin indicated in the graph.

FIG. 9 illustrates a flow diagram of an example method 900 of generating multiple reference voltages (e.g., a first reference voltage and a second reference voltage) in accordance with another aspect of the disclosure. The method 900 includes generating a current through a set of resistors to generate a set of voltages at a set of taps coupled to the set of resistors, respectively (block 910). Examples of means for generating a current through a set of resistors to generate a set of voltages at a set of taps coupled to the set of resistors, respectively, include any of the current sources described herein.

The method 900 further includes outputting one of the set of voltages at a first selected tap as the first reference voltage (block 920). Examples of a means for outputting one of the set of voltages at a first selected tap as the first reference voltage include any of the first set of switching devices SW10 to SW1N. Additionally, the method 900 includes outputting the one or another of the set of voltages at a second selected tap as the second reference voltage (block 930). Examples of means for outputting the one or another of the set of voltages at a second selected tap as the second reference voltage include any of the second set of switching devices SW20 to SW2N.

Further, the method 900 includes coupling a first tap to a second tap of the set of taps based on the first selected tap (block 940). Examples of means for coupling a first tap to a second tap of the set of taps based on the first selected tap include the control circuit 820 and the shorting switching device SWs.

The following provides an overview of aspects of the present disclosure:

Aspect 1: A multi-reference voltage generator, comprising: a current source; a set of resistors coupled in series with the current source between an upper voltage rail and a lower voltage rail; a first set of switching devices coupled between a first output and a set of taps at respective terminals of the set of resistors, wherein the set of taps includes a first tap and a second tap; a second set of switching devices coupled between a second output and the set of taps, respectively; a switching device coupled between the first tap and the second tap; and a control circuit including an output coupled to a control input of the switching device.

Aspect 2: The multi-reference voltage generator of aspect 1, wherein the first tap is situated between the current source and the set of resistors.

Aspect 3: The multi-reference voltage generator of aspect 1 or 2, wherein a subset of the set of resistors are situated between the current source and the second tap.

Aspect 4: The multi-reference voltage generator of any one of aspects 1-3, wherein the control circuit includes an input coupled to a set of control inputs of the first set of switching devices, respectively.

Aspect 5: The multi-reference voltage generator of any one of aspects 1-4, wherein: the set of taps are arranged consecutively from the lower voltage rail to the current source; the first set of switching devices are configured to receive a control signal indicating a number of one of the set of taps, the control signal closing the switching device coupled between the one of the set of taps and the first output, and opening the remaining ones of the first set of switching devices, wherein a first reference voltage is generated at the first output; and the control signal is configured to: close the switching device if the number of the one of the set of taps is at or below a tap threshold; and open the switching device if the number of the one of the set of taps is above the tap threshold.

Aspect 6: The multi-reference voltage generator of aspect 5, wherein a number of the second tap is higher than the number of the one of the set of taps.

Aspect 7: The multi-reference voltage generator of aspect 5 or 6, wherein the second set of switching devices are configured to receive a second control signal indicating a number of the one or another one of the set of taps, the second control signal closing the switching device of the second set of switching devices coupled between the one or the another one of the set of taps and the second output, and opening the remaining ones of the second set of switching devices, wherein a second reference voltage is generated at the second output.

Aspect 8: The multi-reference voltage generator of any one of aspects 1-4, wherein: the first set of switching devices are configured to receive a first control signal identifying one of the first set of switching devices to close; and the control circuit is configured to close the switching device based on the one of the first set of switching devices to close.

Aspect 9: The multi-reference voltage generator of aspect 8, wherein the control circuit is configured to close the switching device based on a number of the set of resistors between one of the set of taps to which the one of the first set of switching device is coupled and the lower voltage rail.

Aspect 10: The multi-reference voltage generator of aspect 9, wherein the control circuit is configured to close the switching device if the number of the set of resistors the one of the set of taps and the lower voltage rail is at or below a tap threshold.

Aspect 11: A method of generating first and second reference voltages, comprising: generating a current through a set of resistors to generate a set of voltages at a set of taps coupled to the set of resistors, respectively; outputting one of the set of voltages at a first selected tap as the first reference voltage; outputting the one or another of the set of voltages at a second selected tap as the second reference voltage; and coupling a first tap to a second tap of the set of taps based on the first selected tap.

Aspect 12: The method of aspect 11, wherein the first tap is situated between a source of the current and the set of resistors.

Aspect 13: The method of aspect 11 or 12, wherein a subset of the set of resistors are situated between a source of the current and the second tap.

Aspect 14: The method of claim 11, wherein: the set of taps are numbered in consecutive order from the tap farthest away from to the tap closest to a source of the current; and coupling the first tap to the second tap is based on the number of the first selected tap being at or below a tap threshold.

Aspect 15: The method of aspect 14, further comprising decoupling the first tap from the second tap based on the number of the first selected tap being above the tap threshold.

Aspect 16: The method of aspect 14 or 15, wherein the first tap is the tap closest to a source of the current.

Aspect 17: The method of any one of aspects 14-16, wherein the number of the second tap is at or above the tap threshold.

Aspect 18: The method of any one of aspects 11-13, wherein the coupling of the first tap to the second tap is based on a number of taps between the first selected tap and the tap farthest away from a source of the current.

Aspect 19: The method of any one of aspects 11-18, wherein: outputting the one of the set of voltages at the first selected tap as the first reference voltage comprises closing a first switching device coupled between the first selected tap and a first output; and outputting the one or the another of the set of voltages at the second selected tap as the second reference voltage comprises closing a second switching device coupled between the second selected tap and a second output.

Aspect 20: The method of any one of aspects 11-19, wherein coupling the first tap to the second tap comprises closing a switching device coupled between the first tap and the second tap.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. A multi-reference voltage generator, comprising:
a current source;
a set of resistors coupled in series with the current source between an upper voltage rail and a lower voltage rail;
a first set of switching devices coupled between a first output and a set of taps at respective terminals of the set of resistors, wherein the set of taps includes a first tap and a second tap;
a second set of switching devices coupled between a second output and the set of taps, respectively;
a switching device coupled between the first tap and the second tap; and
a control circuit including an output coupled to a control input of the switching device.

2. The multi-reference voltage generator of claim 1, wherein the first tap is situated between the current source and the set of resistors.

13

3. The multi-reference voltage generator of claim 1, wherein a subset of the set of resistors are situated between the current source and the second tap.

4. The multi-reference voltage generator of claim 1, wherein the control circuit includes an input coupled to a set of control inputs of the first set of switching devices, respectively.

5. The multi-reference voltage generator of claim 1, wherein:

the set of taps are arranged consecutively from the lower voltage rail to the current source;

the first set of switching devices are configured to receive a first control signal indicating a number of one of the set of taps, the first control signal closing the switching device of the first set of switching devices coupled between the one of the set of taps and the first output, and opening the remaining ones of the first set of switching devices, wherein a first reference voltage is generated at the first output; and the first control signal is configured to:

close the switching device if the number of the one of the set of taps is at or below a tap threshold; and open the switching device if the number of the one of the set of taps is above the tap threshold.

6. The multi-reference voltage generator of claim 5, wherein a number of the second tap is higher than the number of the one of the set of taps.

7. The multi-reference voltage generator of claim 5, wherein the second set of switching devices are configured to receive a second control signal indicating a number of the one or another one of the set of taps, the second control signal closing the switching device of the second set of switching devices coupled between the one or the another one of the set of taps and the second output, and opening the remaining ones of the second set of switching devices, wherein a second reference voltage is generated at the second output.

8. The multi-reference voltage generator of claim 1, wherein:

the first set of switching devices are configured to receive a first control signal identifying one of the first set of switching devices to close; and the control circuit is configured to close the switching device based on the one of the first set of switching devices to close.

9. The multi-reference voltage generator of claim 8, wherein the control circuit is configured to close the switching device based on a number of the set of resistors between one of the set of taps to which the one of the first set of switching device is coupled and the lower voltage rail.

10. The multi-reference voltage generator of claim 9, wherein the control circuit is configured to close the switching device if the number of the set of resistors between the one of the set of taps and the lower voltage rail is at or below a tap threshold.

11. A method of generating first and second reference voltages, comprising:

generating a current through a set of resistors to generate a set of voltages at a set of taps coupled to the set of resistors, respectively;

outputting one of the set of voltages at a first selected tap as the first reference voltage;

outputting the one or another of the set of voltages at a second selected tap as the second reference voltage; and coupling a first tap to a second tap of the set of taps based on the first selected tap.

12. The method of claim 11, wherein the first tap is situated between a source of the current and the set of resistors.

13. The method of claim 11, wherein a subset of the set of resistors are situated between a source of the current and the second tap.

14. The method of claim 11, wherein:

the set of taps are numbered in consecutive order from the tap farthest away from to the tap closest to a source of the current; and coupling the first tap to the second tap is based on the number of the first selected tap being at or below a tap threshold.

15. The method of claim 14, further comprising decoupling the first tap from the second tap based on the number of the first selected tap being above the tap threshold.

16. The method of claim 14, wherein the first tap is the tap closest to a source of the current.

17. The method of claim 14, wherein the number of the second tap is at or above the tap threshold.

18. The method of claim 11, wherein the coupling of the first tap to the second tap is based on a number of taps between the first selected tap and the tap farthest away from a source of the current.

19. The method of claim 11, wherein:

outputting the one of the set of voltages at the first selected tap as the first reference voltage comprises closing a first switching device coupled between the first selected tap and a first output; and outputting the one or the another of the set of voltages at the second selected tap as the second reference voltage comprises closing a second switching device coupled between the second selected tap and a second output.

20. The method of claim 11, wherein coupling the first tap to the second tap comprises closing a switching device coupled between the first tap and the second tap.

* * * * *